(12) United States Patent
Ohhata

(10) Patent No.: US 10,263,634 B2
(45) Date of Patent: Apr. 16, 2019

(54) ANALOG-DIGITAL CONVERTER

(71) Applicant: KAGOSHIMA UNIVERSITY, Kagoshima-shi, Kagoshima (JP)

(72) Inventor: Kenichi Ohhata, Kagoshima (JP)

(73) Assignee: KAGOSHIMA UNIVERSITY, Kagoshima (JP)

( * ) Notice: Subject to any disclaimer, the term of this patent is extended or adjusted under 35 U.S.C. 154(b) by 0 days.

(21) Appl. No.: 15/753,855

(22) PCT Filed: Aug. 3, 2016

(86) PCT No.: PCT/JP2016/072724
§ 371 (c)(1),
(2) Date: Feb. 20, 2018

(87) PCT Pub. No.: WO2017/029984
PCT Pub. Date: Feb. 23, 2017

(65) Prior Publication Data
US 2019/0013820 A1 Jan. 10, 2019

(30) Foreign Application Priority Data
Aug. 19, 2015 (JP) ................................ 2015-162086

(51) Int. Cl.
*H03M 1/56* (2006.01)
*H03M 1/36* (2006.01)
(Continued)

(52) U.S. Cl.
CPC ............ *H03M 1/56* (2013.01); *G04F 10/005* (2013.01); *H03M 1/1245* (2013.01); *H03M 1/14* (2013.01);
(Continued)

(58) Field of Classification Search
CPC ............ H03M 1/00; H03M 1/56; H03M 1/12; H03M 1/14; H03M 1/10
(Continued)

(56) References Cited

U.S. PATENT DOCUMENTS

2007/0279506 A1  12/2007  Sato
2010/0103015 A1*  4/2010  Yoshida ................. H03F 3/387
                                                       341/143
(Continued)

FOREIGN PATENT DOCUMENTS

JP          64-078027 A      3/1989
JP          2007-243324 A    9/2007
(Continued)

OTHER PUBLICATIONS

Translation of PCT/JP2016/072724 to the International Preliminary Report on Patentability, dated Feb. 22, 2018.
(Continued)

*Primary Examiner* — Joseph J Lauture
(74) *Attorney, Agent, or Firm* — Arent Fox LLP

(57) ABSTRACT

AD conversion is performed by using a combination of a parallel AD converter that includes a plurality of comparators to compare an input potential of an analog input signal sampled by a track and hold circuit and reference potentials different from one another and determines a value of a predetermined number of bits on the higher-order side of a digital signal and a single-slope AD converter that reduces the input potential of the analog input signal sampled by the track and hold circuit at a constant speed, converts a time taken until the reduced input potential becomes equal to a reference potential corresponding to the value determined by the parallel AD converter to a digital value, and determines a remaining value on the lower-order side of the digital signal, and thereby the number of bits of the single-slope AD (Continued)

converter can be reduced and high-speed AD conversion is enabled with a small area and low power consumption.

17 Claims, 12 Drawing Sheets

(51) Int. Cl.
*G04F 10/00* (2006.01)
*H03M 1/14* (2006.01)
*H03M 1/12* (2006.01)
*H03M 1/10* (2006.01)
*H03M 1/00* (2006.01)

(52) U.S. Cl.
CPC ............... *H03M 1/36* (2013.01); *H03M 1/00* (2013.01); *H03M 1/10* (2013.01); *H03M 1/12* (2013.01)

(58) Field of Classification Search
USPC .................. 341/169, 155, 156, 120, 166
See application file for complete search history.

(56) References Cited

U.S. PATENT DOCUMENTS

| 2013/0120180 A1 | 5/2013 | Kawahito |
| 2015/0014517 A1 | 1/2015 | Ikebe |

FOREIGN PATENT DOCUMENTS

| WO | WO 2011/142452 A1 | 11/2011 |
| WO | WO 2013/122221 A1 | 8/2013 |

OTHER PUBLICATIONS

International Search Report of related International Patent Application No. PCT/JP2016/072724 dated Nov. 1, 2016.
Van De Plassche, Rudy, CMOS Integrated Analog-to-Digital and Digital-to-Analog Converters, Kluwer Academic Publishers, 2003.
Lee, Dongmyung, et al., Low-Noise In-Pixel Comparing Active Pixel Sensor Using Column-Level Single-Slope ADC, IEEE Transactions on Electron Devices, vol. 55, No. 12, pp. 3383-3388, Dec. 2008.

* cited by examiner

F I G. 1A
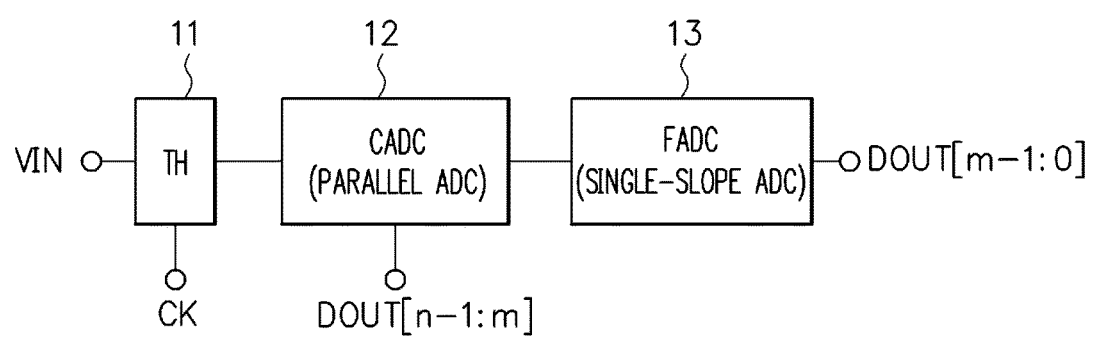
F I G. 1B
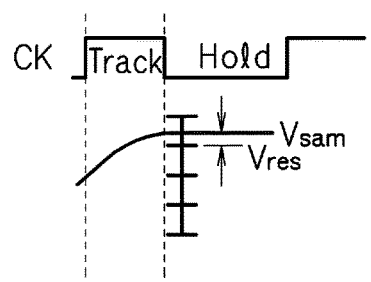

F I G. 2A
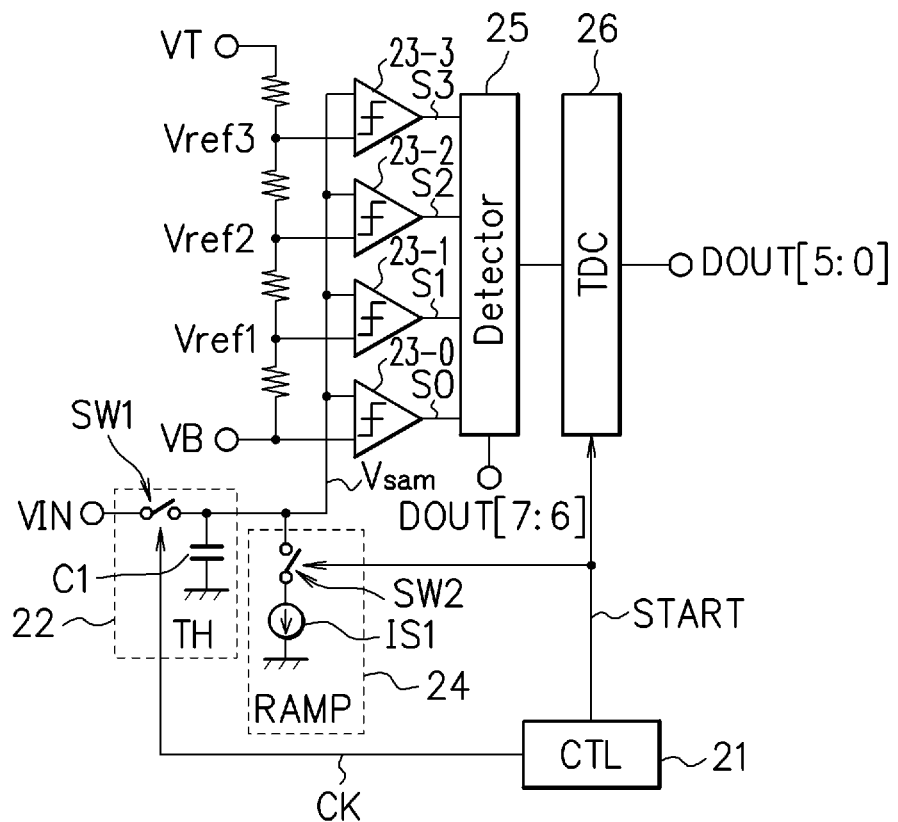

F I G. 4A
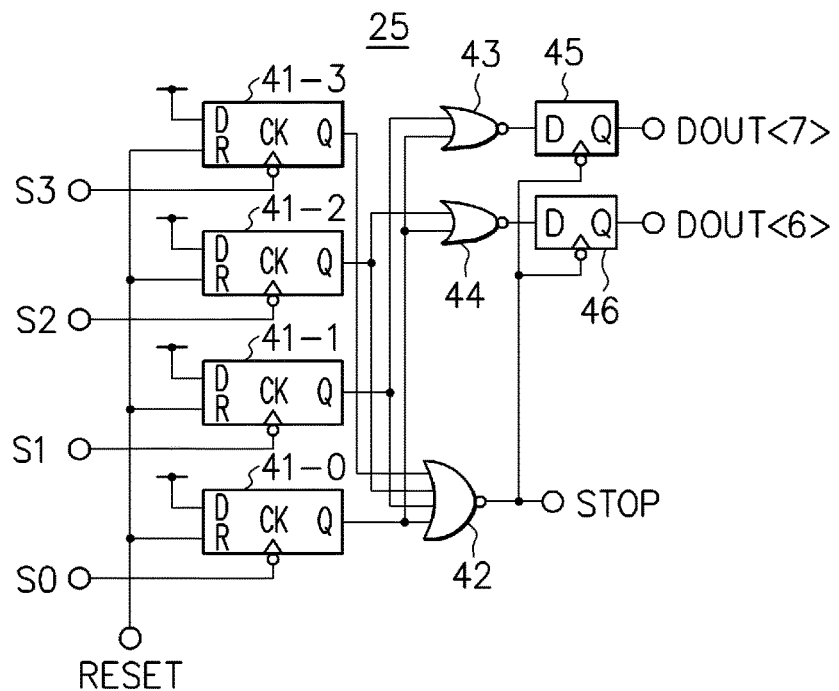
F I G. 4B
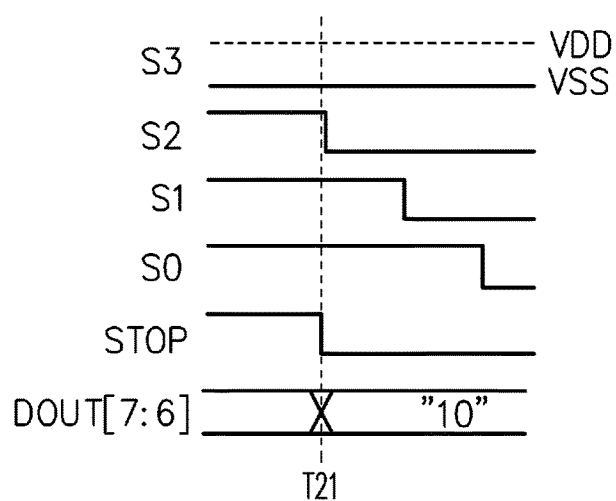

F I G. 7C
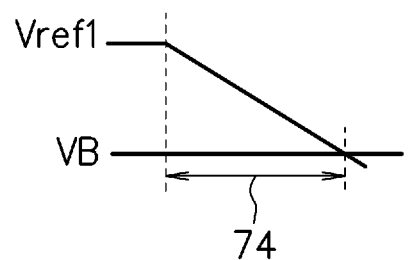

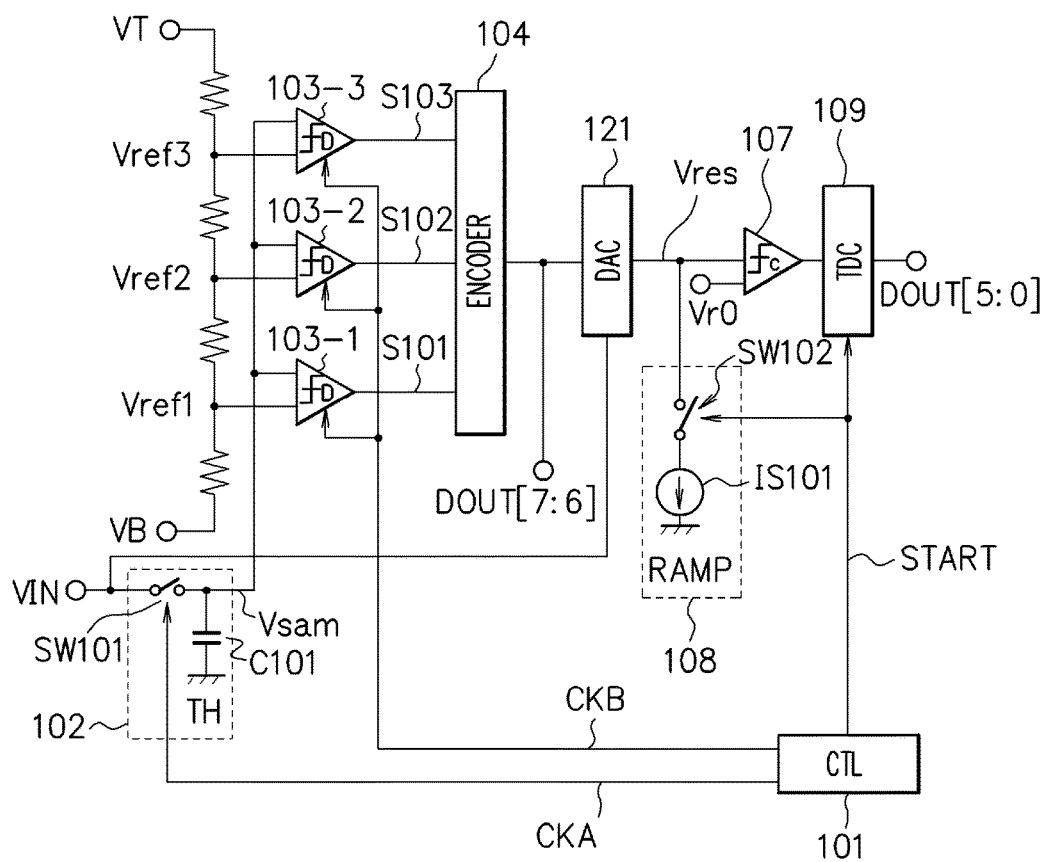
F I G. 12

F I G. 13
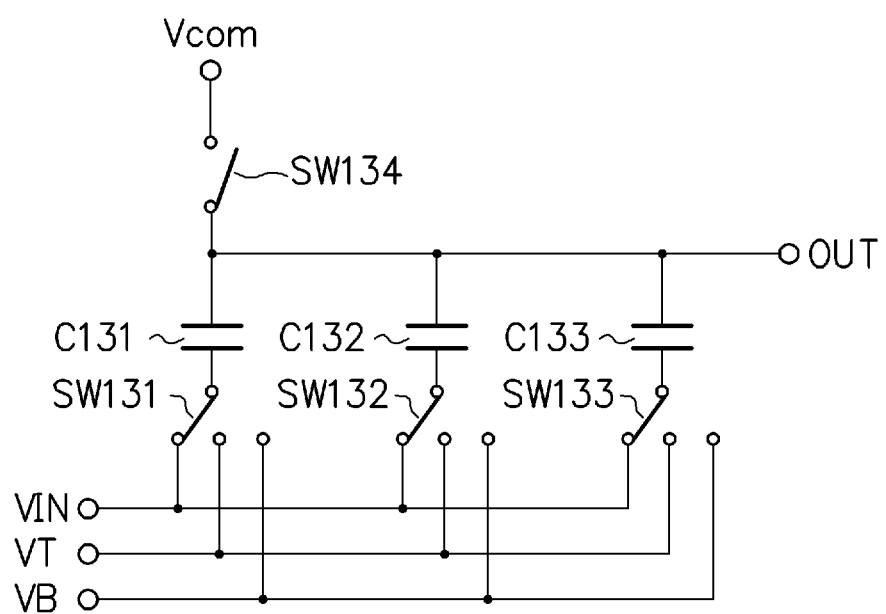

ANALOG-DIGITAL CONVERTER

CROSS-REFERENCE TO RELATED APPLICATIONS

This application is a National Stage entry of International Application No. PCT/JP2016/072724, filed Aug. 3, 2016, which claims priority to Japanese Patent Application No. 2015-162086, filed Aug. 19, 2015. The disclosures of the priority applications are incorporated in their entirety herein by reference.

TECHNICAL FIELD

The present invention relates to an analog-digital converter (AD converter).

BACKGROUND ART

There is a single-slope AD converter as one of analog-digital converters (AD converters) that convert analog signals to digital signals (see Non-Patent Literatures 1, 2, for example). The single-slope AD converter is an AD converter having a small area and low power consumption, but has the drawback of slow conversion speed. Therefore, the use of the single-slope AD converter has been limited to an image sensor, and so on conventionally.

FIG. 9A is a diagram illustrating a configuration example of a single-slope AD converter, and FIG. 9B is a view illustrating a principle of operation of the single-slope AD converter. The single-slope AD converter illustrated in FIG. 9A includes: a track and hold (TH) circuit 91; a comparator 92; a ramp circuit (RAMP) 93; and a time to digital converter (TDC) 94.

The track and hold circuit 91 includes: a switch SW91 that is on/off controlled by a clock signal CK and transmits an analog input signal VIN; and a holding capacitance C91 that holds the analog input signal VIN transmitted via the switch SW91. The comparator 92 compares an input potential $V_{sam}$ and a reference potential Vref to output a signal S91 according to a result of the comparison. The input potential $V_{sam}$ is a potential according to the analog input signal VIN input and held by the track and hold circuit 91, and is reduced at a constant speed by the ramp circuit 93 during a comparing period in an AD conversion operation.

The ramp circuit 93 includes: a switch SW92; and a current source IS91 to be connected to an input node of the input potential $V_{sam}$ via the switch SW92. At the time of a comparing operation of AD conversion processing, the switch SW92 is turned on, the current source IS91 is connected to the input node of the input potential $V_{sam}$, and the ramp circuit 93 reduces the input potential $V_{sam}$ at a constant speed. The time to digital converter 94 converts a time difference indicated by the signal S91 output from the comparator 92 to a digital value to output it as a digital signal DOUT.

In the single-slope AD converter illustrated in FIG. 9A, as illustrated in FIG. 9B as one example, the input analog input signal VIN is sampled by the track and hold circuit 91 at times T91 to T92 at which the clock signal OK is at a high level. After the analog input signal VIN is sampled by the track and hold circuit 91, the comparing operation of the AD conversion processing is started from a time T93 and the ramp circuit 93 reduces the input potential $V_{sam}$ according to the sampled analog input signal VIN at a constant speed. In the comparing operation of the AD conversion processing, the signal S91 to be output from the comparator 92 when the ramp circuit 93 starts to reduce the input potential $V_{sam}$ according to the analog input signal VIN (when the comparing operation is started) is at a high level because the input potential $V_{sam}$ is higher than the reference potential Vref (time T93). Thereafter, when the input potential $V_{sam}$ is reduced to be equal to the reference potential Vref, the signal S91 to be output from the comparator 92 is brought to a low level (time T94).

A time period taken until the input potential $V_{sam}$ becomes equal to the reference potential Vref after the ramp circuit 93 starts to reduce the input potential $V_{sam}$, namely a time $t_{sam}$ of the times T93 to T94 at which the signal S91 to be output from the comparator 92 is at a high level is converted to a digital value by the time to digital converter 94. The time $t_{sam}$ is proportional to a potential Vs according to the analog input signal VIN held by the track and hold circuit 91 when the comparing operation of the AD conversion processing is started, and thus the output of the time to digital converter 94 becomes an AD conversion result of the analog input signal VIN.

In this manner, a digital value DOUT2 obtained by the AD conversion of the analog input signal VIN sampled at the times T91 to T92 is output as the digital signal DOUT. Incidentally, a digital value DOUT1 is an AD conversion result of the analog input signal VIN sampled one before.

When the number of bits of the time to digital converter 94 is set to n (an output value is 0 to ($2^n$−1)) and a time resolution is set to Δt in the single-slope AD converter illustrated in FIG. 9A, the maximum value $t_{sam}$(max) of the time $t_{sam}$ is expressed as $2^n$Δt. When fabrication of a single-slope AD converter that converts to a 10-bit digital signal is considered, for example, the time $t_{sam}$(max) becomes 102.4 ns in the case of the time resolution Δt being 100 ps. A sampling period Ts of an input signal in the AD converter is substantially equal to the sum of a track period $t_{tr}$ and the time $t_{sam}$(max), and thus a sampling frequency of the AD converter becomes 10 MHz or less.

In this manner, the single-slope AD converter has had difficulty in achieving speeding up because a conversion time increases exponentially with respect to the accuracy (bit number) in spite of a small number of components, a small circuit area, and low power consumption.

CITATION LIST

Non Patent Literature

Non Patent Literature 1: Rudy van de Plassche, CMOS Integrated Analog-to-Digital and Digital-to-Analog Converters, Kluwer Academic Publishers, 2003

Non Patent Literature 2: Dongmyung Lee et al., "Low-Noise In-Pixel Comparing Active Pixel Sensor Using Column-Level Single-Slope ADC", IEEE Transactions on Electron Devices, vol. 55, no. 12, pp. 3383-3388, December 2008

SUMMARY OF INVENTION

Technical Problem

An object of the present invention is to provide an AD converter capable of performing high-speed AD conversion with a small area and low power consumption.

Solution to Problem

An analog-digital converter according to the present invention being an analog-digital converter that converts an input analog input signal to a digital signal, the analog-digital converter includes: a track and hold circuit that samples the analog input signal; a parallel analog-digital converter that includes a plurality of comparators and determines a value of a predetermined number of bits on the higher-order side of the digital signal based on outputs of the plurality of comparators, the plurality of comparators to which an input potential according to the sampled analog input signal and reference potentials different from one another are input and that each compare the input potential and the reference potential; and a single-slope analog-digital converter that reduces the input potential according to the sampled analog input signal at a constant speed, converts a time taken until the reduced input potential becomes equal to the reference potential corresponding to the value determined in the parallel analog-digital converter to a digital value, and determines a remaining value on the lower-order side of the digital signal.

Advantageous Effects of Invention

According to the present invention, a parallel analog-digital converter and a single-slope analog-digital converter are combined, conversion of the higher-order side of a digital signal is performed in the parallel analog-digital converter, and conversion of the lower-order side of the digital signal is performed in the single-slope analog-digital converter. This makes it possible to reduce the number of bits of the single-slope analog-digital converter, resulting in that it becomes possible to provide an analog-digital converter capable of performing high-speed analog-digital conversion with a small area and low power consumption.

BRIEF DESCRIPTION OF DRAWINGS

FIG. 1A is a diagram schematically illustrating an analog-digital converter in an embodiment of the present invention.

FIG. 1B is a view explaining an operation of the analog-digital converter illustrated in FIG. 1A.

FIG. 2A is a diagram illustrating a configuration example of the analog-digital converter in a first embodiment.

FIG. 4A is a diagram illustrating a configuration example of a detection circuit in the first embodiment.

FIG. 4B is a timing chart illustrating an operation example of the detection circuit in the first embodiment.

FIG. 7C is a view explaining a current amount adjustment relating to the error correction.

FIG. 12 is a diagram illustrating another configuration example of the analog-digital converter in the second embodiment.

FIG. 13 is a diagram illustrating a configuration example of a capacitive DA converter in the second embodiment.

DESCRIPTION OF EMBODIMENTS

Figure 2B:
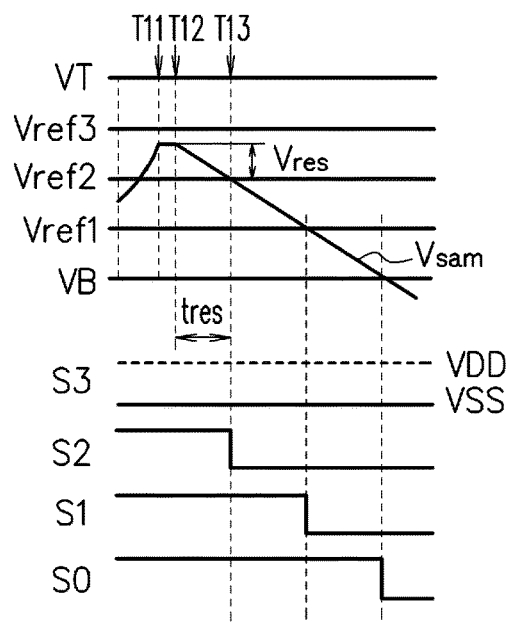
FIG. 2B is a view explaining an operation of a comparator in the first embodiment.

Hereinafter, there will be explained embodiments of the present invention based on the drawings.

First Embodiment

There will be explained a first embodiment of the present invention.

FIG. 1A is a schematic diagram illustrating an analog-digital converter (AD converter) in one embodiment of the present invention. As illustrated in FIG. 1A, the AD converter in this embodiment includes: a track and hold circuit 11; and AD converters 12, 13, and converts an input analog input signal VIN to an n-bit (n being a natural number) digital signal DOUT[n−1:0] to output it.

The track and hold (TH) circuit 11 is controlled by a clock signal CK and samples the input analog input signal VIN to supply the sampled analog input signal VIN to the AD converters 12, 13. As illustrated in FIG. 1B, for example, when the clock signal CK is at a high level, the track and hold circuit 11 enters a track mode and transmits the analog input signal VIN to output it. Further, when the clock signal CK is at a low level, the track and hold circuit 11 enters a hold mode and holds the analog input signal VIN transmitted in the track mode.

The AD converter (CADC) 12 is an (n-m)-bit (m being a natural number smaller than n) parallel AD converter. The AD converter (CADC) 12 performs AD conversion processing of (n-m) bits on the higher-order side of the digital signal DOUT[n−1:0] (for determining a value of (n-m) bits). The AD converter (CADC) 12, as illustrated in FIG. 1B as one example, judges whether a potential $V_{sam}$ of the sampled analog input signal VIN exists between reference potentials among a plurality of reference potentials different from one another that are each set to have a constant potential difference, to thereby determine a value of an output digital signal DOUT[n−1:m].

The AD converter (FADC) 13 is an m-bit single-slope AD converter. The AD converter (FADC) 13 performs AD conversion processing of m bits on the lower-order side of the digital signal DOUT[n−1:0] (for determining a value of m bits). The AD converter (FADC) 13 reduces the potential $V_{sam}$ of the sampled analog input signal VIN at a constant speed and converts a time taken until the potential becomes equal to the maximum reference potential out of the reference potentials lower than the potential $V_{sam}$ to a digital value, to thereby determine a value of an output digital signal DOUT[m−1:0]. Thereby, the AD converter (FADC) 13, as illustrated in FIG. 1B as one example, performs AD conversion processing of a residual component resulting from the AD conversion processing in the AD converter (CADC) 12, in other words, a potential difference (a residual component) $V_{res}$ between the potential $V_{sam}$ of the sampled analog input signal VIN and the maximum reference potential out of the reference potentials lower than the potential $V_{sam}$ and determines the value of the digital signal DOUT [m−1:0] to output.

In this manner, in this embodiment, the (n−m)-bit parallel AD converter and the m-bit single-slope AD converter are combined to perform AD conversion to convert the analog input signal VIN to the n-bit digital signal DOUT[n−1:0]. Regarding the conversion from the analog input signal VIN to the digital signal DOUT[n−1:0], coarse conversion is performed in the parallel AD converter having an excellent high-speed property, and conversion of a residual component of the above is performed in the single-slope AD converter.

Application of such a configuration makes it possible to reduce the conversion time in the single-slope AD converter by reducing the number of bits of the single-slope AD converter and to fabricate a high-speed AD converter with a small area and low power consumption. The n-bit AD converter is configured by combining the (n−m)-bit parallel AD converter and the m-bit single-slope AD converter, thereby making it possible to reduce a comparing operation period of the AD conversion processing in the single-slope AD converter to about $\frac{1}{2}^{n-m}$ as compared to the case of the configuration only by the n-bit single-slope AD converter.

FIG. 2A is a diagram illustrating a configuration example of the AD converter in the first embodiment. FIG. 2A illustrates an AD converter that converts an analog input signal VIN to an 8-bit digital signal DOUT[7:0] as one example. In this example, AD conversion processing of two bits DOUT[7:6] on the higher-order side of the digital signal DOUT[7:0] is performed in the parallel AD converter and AD conversion processing of six bits DOUT[5:0] on the lower-order side of the digital signal DOUT[7:0] is performed in the single-slope AD converter.

The AD converter in the first embodiment illustrated in FIG. 2A as an example includes: a control circuit 21; a track and hold circuit 22; comparators 23-0, 23-1, 23-2, and 23-3; a ramp circuit 24; a detection circuit 25; and a time to digital converter 26. The function as the parallel AD converter is achieved by the comparators 23-0 to 23-3, the detection circuit 25, and so on, and the function as the single-slope AD converter is achieved by the comparators 23-0 to 23-3, the ramp circuit 24, the detection circuit 25, the time to digital converter 26, and so on.

The control circuit 21 controls the AD conversion processing from the analog input signal VIN to the digital signal DOUT overall. For example, the control circuit 21 outputs a clock signal CK to control the operation of the track and hold circuit 22 and a start signal START to control the operations of the ramp circuit 24 and the time to digital converter 26.

The track and hold (TH) circuit 22 includes: a switch SW1 that is on/off controlled by the clock signal CK and transmits the analog input signal VIN; and a holding capacitance C1 that holds the analog input signal VIN transmitted via the switch SW1.

When the clock signal CK is at a high level, the switch SW1 is turned on (conducted) and the track and hold circuit 22 enters a track mode, and when the clock signal CK is at a low level, the switch SW1 is turned off (is not conducted) and the track and hold circuit 22 enters a hold mode. In the track mode, the input analog input signal VIN is transmitted to an output end via the switch SW1, and in the hold mode, the analog input signal VIN transmitted in the track mode is held.

To the comparator 23-0, an input potential $V_{sam}$ and a reference potential VB are input. The comparator 23-0 compares the input potential $V_{sam}$ and the reference potential VB to output an output signal S0 according to a result of the comparison. Further, to the comparator 23-1, the input potential $V_{sam}$ and a reference potential Vref1 are input. The comparator 23-1 compares the input potential $V_{sam}$ and the reference potential Vref1 to output an output signal S1 according to a result of the comparison.

To the comparator 23-2, the input potential $V_{sam}$ and a reference potential Vref2 are input. The comparator 23-2 compares the input potential $V_{sam}$ and the reference potential Vref2 to output an output signal S2 according to a result of the comparison. Further, to the comparator 23-3, the input potential $V_{sam}$ and a reference potential Vref3 are input. The comparator 23-3 compares the input potential $V_{sam}$ and the reference potential Vref3 to output an output signal S3 according to a result of the comparison.

Here, as illustrated in FIG. 2B, the input potential $V_{sam}$ is a potential according to the analog input signal VIN input and held by the track and hold circuit 22 at the time when the sampling operation of the AD conversion processing is completed (at a time T11 when the track mode is finished), and the input potential $V_{sam}$ is reduced at a constant speed by the ramp circuit 24 at the time of the comparing operation of the AD conversion processing (at and after a time T12). Further, the reference potentials VB, Vref1, Vref2, and Vref3 are generated by a resistor ladder circuit that includes a plurality of resistors each having the same resistance value connected in series resistance-dividing the voltage between a reference voltage VB on the low-potential side and a reference voltage VT on the high-potential side, for example, and the potential increases by a constant potential difference in the order of the potentials VB, Vref1, Vref2, Vref3, and VT.

Figure 3:
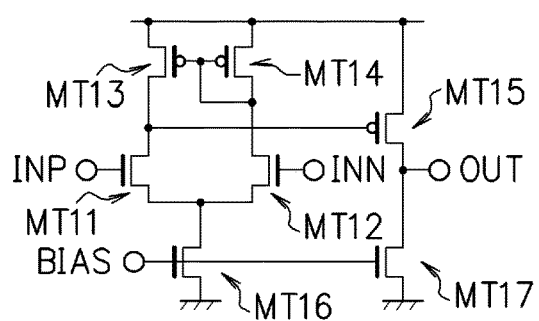
FIG. 3 is a view illustrating a configuration example of the comparator in the first embodiment.

Each configuration example of the comparators (23-0 to 23-3) in this embodiment is illustrated in FIG. 3. The comparator 23 illustrated in FIG. 3 is a comparator using a differential pair (a driving unit) and a current mirror circuit (a load unit), and includes: N-channel MOS (metal oxide semiconductor) transistors MT11, MT12, MT16, and MT17; and P-channel MOS transistors MT13, MT14, and MT15.

The transistor MT11 has an input signal INP supplied to a gate thereof, has a source thereof connected to a drain of the transistor MT16, and has a drain thereof connected to a drain of the transistor MT13. The transistor MT12 has an input signal INN supplied to a gate thereof, has a source thereof connected to the drain of the transistor MT16, and has a drain thereof connected to a drain of the transistor MT14. In the comparator 23 in this embodiment, the input potential $V_{sam}$ is input as the input signal INP and the reference potential is input as the input signal INN.

A power supply voltage is supplied to sources of the transistors MT13 and MT14. A gate of the transistor. MT13 and a gate of the transistor MT14 are connected and a connection point of them is connected to the drain of the transistor MT14. That is, the transistors MT13 and MT14 are current-mirror connected.

The transistor MT15 has a gate thereof connected to a connection point of the drain of the transistor MT11 and the drain of the transistor MT13, has the power supply voltage supplied to a source thereof, and has a drain thereof connected to a drain of the transistor MT17. A potential of a connection point of the drain of the transistor MT15 and the drain of the transistor MT17 is output as an output signal OUT. The transistors MT16 and MT17 each have a source thereof connected to a reference voltage, have a bias signal BIAS having a predetermined voltage supplied to a gate thereof, and function as a current source.

According to the configuration illustrated in FIG. 3, when the potential of the input signal INP is higher than that of the input signal INN (the input potential $V_{sam}$ is higher than the reference potential), the transistor MT15 is turned on and the output signal OUT is brought to a high level because more current flows to the input signal INP side of the differential pair. On the other hand, when the potential of the input signal INP is lower than that of the input signal INN (the input potential $V_{sam}$ is lower than the reference potential), the transistor. MT15 is turned off and the output signal OUT is brought to a low level because more current flows to the input signal INN side of the differential pair.

Therefore, as illustrated in FIG. 2B, when the input potential $V_{sam}$ is higher than the reference potential as a result that the comparators 23-0 to 23-3 illustrated in FIG. 2A each compare the input potential $V_{sam}$ and the reference potential, the output signals S0 to S3 are brought to a high level (a power supply voltage VDD). On the other hand, when the input potential $V_{sam}$ is equal to or less than the reference potential, the output signals S0 to S3 are brought to a low level (a reference voltage VSS).

The ramp circuit (RAMP) 24 includes: a switch SW2 that is on/off controlled by the start signal START; and a current source IS1 that is connected to an input node of the input potential $V_{sam}$ via the switch SW2. Here, the start signal START is at a high level at the time of the comparing operation of the AD conversion processing (at and after the time T12 illustrated in FIG. 25). When the start signal START is at a high level, the switch SW2 is turned on, the current source IS1 is connected to the input node of the input potential $V_{sam}$, and the ramp circuit 24 reduces the input potential $V_{sam}$ at a constant speed.

The detection circuit 25 detects which one of the output signals S0 to S3 of the comparators 23-0 to 23-3 has transited to a low level from a high level earliest in the AD conversion processing. The detection circuit 25 determines the value of the two bits DOUT[7:6] on the higher-order side of the digital signal DOUT [7:0] according to a result of the detection of the output signal that has transited to a low level from a high level earliest in the AD conversion processing, namely which one of the output signals S0 to S3 has transited earliest.

As illustrated in FIG. 2B, for example, it is set that at a time T13, the high/low relationship between the input potential $V_{sam}$ and the reference potential Vref2 is inverted and the output signal S2 of the comparator 23-2 has transited to a low level from a high level earliest. In this case, the potential of the sampled analog input signal VIN has existed between the reference potential Vref2 and the reference potential Vref3, and thus the detection circuit 25 determines the value of the digital signal DOUT[7:6] as "10." Further, the detection circuit 25, when any one of the output signals S0 to S3 transits to a low level from a high level, brings a stop signal STOP to a low level. Incidentally, the stop signal STOP is a negative logic signal and is reset to a high level before start of the comparing operation of the AD conversion processing.

FIG. 4A is a diagram illustrating a configuration example of the detection circuit 25 in this embodiment. The detection circuit 25 in this embodiment, as illustrated in FIG. 4A, for example, includes: flip-flops (with reset) 41-0, 41-1, 41-2, and 41-3; NOR circuits (logical sum operation circuits) 42, 43, and 44; and flip-flops 45 and 46.

A power supply voltage is supplied to data input terminals (D) of the flip-flops 41-0 to 41-3, and a reset signal RESET is input to reset signal input terminals (R) thereof. The output signal S0 of the comparator 23-0 is input to a clock signal input terminal (CK) of the flip-flop 41-0, and the output signal S1 of the comparator 23-1 is input to a clock signal input terminal (CK) of the flip-flop 41-1. Further, the output signal S2 of the comparator 23-2 is input to a clock signal input terminal (CK) of the flip-flop 41-2, and the output signal S3 of the comparator 23-3 is input to a clock signal input terminal (CK) of the flip-flop 41-3.

The outputs from output terminals (Q) of the flip-flops 41-0 to 41-3 are input to the NOR circuit 42, and the NOR circuit 42 outputs an arithmetic result of the outputs as the stop signal STOP. The outputs from the output terminals (Q) of the flip-flops 41-0 and 41-1 are input to the NOR circuit 43, and the NOR circuit 43 outputs an arithmetic result of the outputs. The outputs from the output terminals (Q) of the flip-flops 41-0 and 41-2 are input to the NOR circuit 44, the NOR circuit 44 and outputs an arithmetic result of the outputs.

The output of the NOR circuit 43 is input to a data input terminal (D) of the flip-flop 45, and the output of the NOR circuit 42 is input to a clock signal input terminal (CK) thereof. The output of the NOR circuit 44 is input to a data input terminal (D) of the flip-flop 46, and the output of the NOR circuit 42 is input to a clock signal input terminal (CK) thereof. An output from an output terminal (Q) of the flip-flop 45 is output as a digital signal DOUT[7], and an output from an output terminal (Q) of the flip-flop 46 is output as a digital signal. DOUT[6].

In the detection circuit 25 illustrated in FIG. 4A, the outputs of the flip-flops 41-0 to 41-3 have been reset by the reset signal RESET before the comparing operation of the AD conversion processing starts, and the outputs are at a low level ("0") at the time when the comparing operation of the AD conversion processing starts. Then, when the output signals S0 to S3 fall, namely transit to a low level from a high level after the comparing operation of the AD conversion processing starts, the outputs of the flip-flops 41-0 to 41-3 in which the transited output signals S0 to S3 have been input to the clock signal input terminals (CK) respectively are brought to a high level ("1") from a low level ("0").

When the output of any one of the flip-flops 41-0 to 41-3 changes to a high level ("1") from the state where the outputs of all the flip-flops 41-0 to 41-3 are at a low level ("0"), the output of the NOR circuit 42 (the stop signal STOP) is brought to a low level from a high level. The output of the NOR circuit 42 is brought to a low level from a high level, and thereby the flip-flops 45 and 46 take in the outputs of the NOR circuits 43 and 44 to hold the outputs and output the outputs as the digital signal DOUT [7] and the digital signal DOUT[6] respectively.

As illustrated in FIG. 4B, for example, when the output signal S2 of the comparator 23-2 transits to a low level from a high level earliest at a time T21, the output of the flip-flop 41-2 is brought to a high level ("1") from a low level ("0"). That is, the output of the flip-flop 41-2 is at a high level ("1"), and the outputs of the flip-flops 41-0, 41-1, and 41-3 other than that are at a low level ("0").

Thereby, the output of the NOR circuit 42 is brought to a low level from a high level. Further, the output of the NOR circuit 43 is at a high level ("1") and the output of the NOR circuit 44 is at a low level ("0"). The output of the NOR circuit 42 is brought to a low level from a high level, and thereby the flip-flop 45 takes in the high level ("1") being the output of the NOR circuit 43 to hold it, and the flip-flop 46 takes in the low level ("0") being the output of the NOR circuit 44 to hold it.

Accordingly, at the time T21, the output signal S2 of the comparator 23-2 transits to a low level from a high level, and thereby the stop signal STOP is brought to a low level from a high level and as the digital signal DOUT[7:6], the value of "10" is output. Incidentally, even when the other output signals S0, S1, and S3 transit to a low level from a high level after the output signal S2 transits to a low level from a high level, the output of the NOR circuit 42 does not change even by the transits of the other output signals S0, S1, and S3, and thus the stop signal STOP does not change either. Further, the output of the NOR circuit 42 does not change, and thus the flip-flops 45 and 46 keep the holding values and the digital signal DOUT[7:6] does not change either.

Further, when the output signal S3 of the comparator 23-3 transits to a low level from a high level earliest, only the output of the flip-flop 41-3 is brought to a high level ("1"), and thus as the digital signal DOUT[7:6], the value of "11" is output. When the output signal S1 of the comparator 23-1 transits to a low level from a high level earliest, only the output of the flip-flop 41-1 is brought to a high level ("1"), and thus as the digital signal DOUT[7:6], the value of "01" is output. When the output signal S0 of the comparator 23-0 transits to a low level from a high level earliest, only the output of the flip-flop 41-0 is brought to a high level ("1"), and thus as the digital signal DOUT[7:6], the value of "00" is output.

Returning to FIG. 2A, the time to digital converter (TDC) 26 measures a time difference taken until the stop signal STOP transits to a low level after the start signal START transits to a high level and converts the time difference to a digital value, to thereby determine the value of the six bits DOUT[5:0] on the lower-order side of the digital signal DOUT[7:0]. The time at which the start signal START has transited to a high level corresponds to a time at which the ramp circuit 24 starts to reduce the input potential $V_{sam}$ at a constant speed (the time T12 in the example illustrated in FIG. 2B). The time at which the stop signal STOP has transited to a low level corresponds to a time at which any one (the earliest one) of the output signals S0 to S3 of the comparators 23-0 to 23-3 has transited to a low level from a high level (the time T13 in the example illustrated in FIG. 2B).

That is, a time difference $t_{res}$ taken until the stop signal STOP transits to a low level after the start signal START transits to a high level, which is measured by the time to digital converter 26, is equivalent to the result resulting from conversion of the potential difference (the residual component) $V_{res}$ between the input potential $V_{sam}$ of the sampled analog input signal VIN and the maximum reference potential out of the reference potentials lower than the input potential $V_{sam}$ to a time. Accordingly, by the time to digital converter 26, the measured time difference $t_{res}$ is converted to a digital value, thereby obtaining the value of a digital signal DOUT[5:0].

Figure 5:
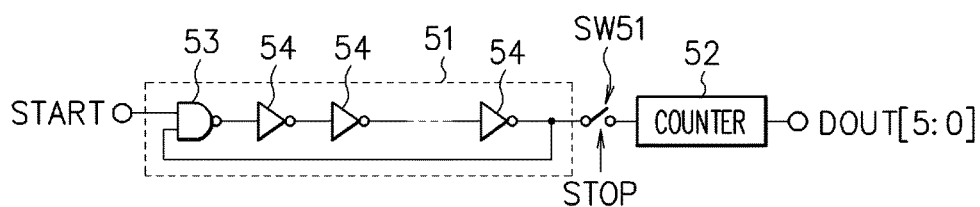
FIG. 5 is a diagram illustrating a configuration example of a time to digital converter in the first embodiment.

FIG. 5 is a diagram illustrating a configuration example of the time to digital converter 26 in this embodiment. The time to digital converter 26 illustrated in FIG. 5 includes: a ring oscillator 51: a switch SW51; and a counter 52.

The ring oscillator 51 includes: a NAND (negative logical product operation) circuit 53; and a plurality of inverters 54. The even-numbered inverters 54 are arranged, and the NAND circuit 53 and the even-numbered inverters 54 are connected in series. To the NAND circuit 53, the start signal START and an output of the inverter 54 connected to the previous stage (or the final stage) are input, and an output of the NAND circuit 53 is input to the inverter 54 connected to the next stage (or the initial stage).

The switch SW51 is provided between an output of the ring oscillator 51 and an input of the counter 52, and is on/off controlled by the stop signal STOP. When the stop signal STOP is at a high level, the switch SW51 is turned on (conducted), and when the stop signal STOP is at a low level, the switch SW51 is turned off (is not conducted). The counter 52 counts the output of the ring oscillator 52 to be input thereto via the switch SW51, and outputs a count value as the digital signal DOUT[5:0].

In the time to digital converter 26 illustrated in FIG. 5, when the start signal START transits to a high level from a low level, the ring oscillator 51 outputs an oscillation signal. The stop signal STOP is at a high level before the start signal START transits to a high level (or at the same time as the start signal START transits to a high level), and thus the oscillation signal output by the ring oscillator 51 is input to the counter 52 via the switch SW51. Thereafter, when the stop signal STOP transits to a low level from a high level, the switch SW51 is turned off and input of the oscillation signal to the counter 52 from the ring oscillator 51 cut. During this period, the counter 52 is counting the output of the ring oscillator 51 to output a count value as the digital signal DOUT[5:0].

Figure 6A:
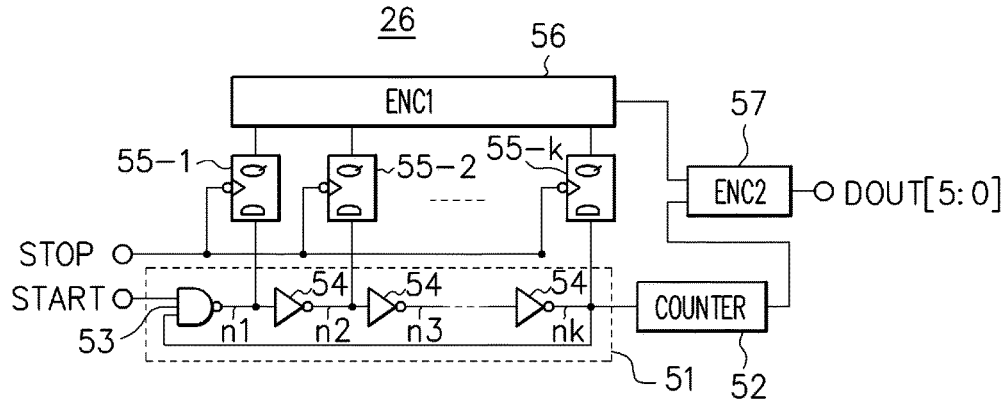
FIG. 6A is a diagram illustrating another configuration example of the time to digital converter in the first embodiment.

FIG. 6A is a diagram illustrating another configuration example of the time to digital converter 26 in this embodiment. The time to digital converter 26 illustrated in FIG. 5 is configured to be small in area and low in power consumption, but a cycle of the output (oscillation signal) of the ring oscillator 51 becomes a time resolution and it is large. Thus, in the example illustrated in FIG. 6A, phase information of internal nodes of the ring oscillator 51 is used to thereby enable measurement with a smaller time resolution.

The time to digital converter 26 illustrated in FIG. 6A includes: a ring oscillator 51; a counter 52; flip-flops 55-1, 55-2, . . . , 55-$k$; a first encoder (ENC1) 56; and a second encoder (ENC2) 57. The ring oscillator 51 includes: a NAND circuit 53; and even-numbered inverters 54, and they are connected in series. To the NAND circuit 53, the start signal START and an output of the inverter 54 connected to the previous stage (or the final stage) are input, and an output of the NAND circuit 53 is input to the inverter 54 connected to the next stage (or the initial stage). The counter 52 counts an output of the ring oscillator 51 and outputs a count value to the second encoder 57.

Data input terminals (D) of the flip-flops 55-1, 55-2, . . . , 55-$k$ are connected to corresponding internal nodes n1, n2, . . . , nk of the ring oscillator 51 respectively, and the stop signal STOP is input to clock signal input terminals (CK) of the flip-flops 55-1, 55-2, . . . , 55-$k$. The outputs from output terminals (Q) of the flip-flops 55-1, 55-2, . . . , 55-$k$ to the first encoder, the first encoder 56 encodes them and outputs a result of the encoding to the second encoder 57. The second encoder 57 encodes the count value from the counter 52 and the result of the encoding from the first encoder 56 to convert the resultant to the digital signal DOUT[5:0] to output it.

In the time to digital converter 26 illustrated in FIG. 6A, when the start signal START transits to a high level from a low level, the ring oscillator 51 outputs an oscillation signal. The oscillation signal output by the ring oscillator 51 is input to the counter 52 to be counted and a count value is output to the second encoder 57.

Then, when the stop signal STOP transits to a low level from a high level, states of the internal nodes n1, n2, . . . , nk at that time (signal levels) are taken in the flip-flops 55-1, 55-2, . . . , 55-$k$ to be output to the first encoder 56. The first encoder 56 encodes the outputs of the flip-flops 55-1, 55-2, . . . , 55-$k$ to output a result of the encoding to the second encoder 57. The count value output from the counter 52 and the result of the encoding output from the first encoder 56 are encoded by the second encoder 57 to be converted to the digital signal DOUT[5:0], and the digital signal DOUT[5:0] is output.

Figure 6B:
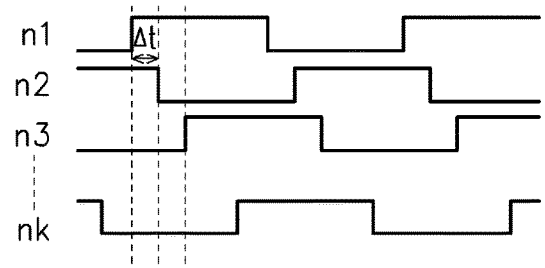
FIG. 6B is a view explaining a time resolution in the time to digital converter illustrated in FIG. 6A.

By using the phase information of the internal nodes n1, n2, ..., nk of the ring oscillator 51, as illustrated in FIG. 6B, the time to digital converter 26 illustrated in FIG. 6A enables measurement with a small time resolution Δt corresponding to a signal transmission time between the NAND circuit 53 and the inverter 54 in the ring oscillator 51 and between the inverters 54 in the ring oscillator 51.

Figure 7A:
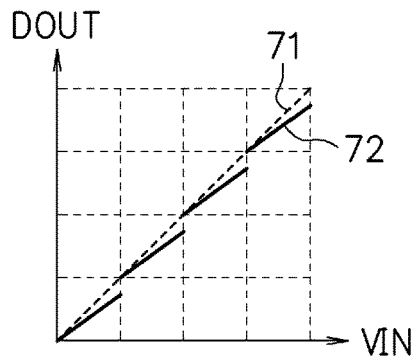
FIG. 7A is a view illustrating one example of a digital signal responsive to an analog input signal.
Figure 7B:
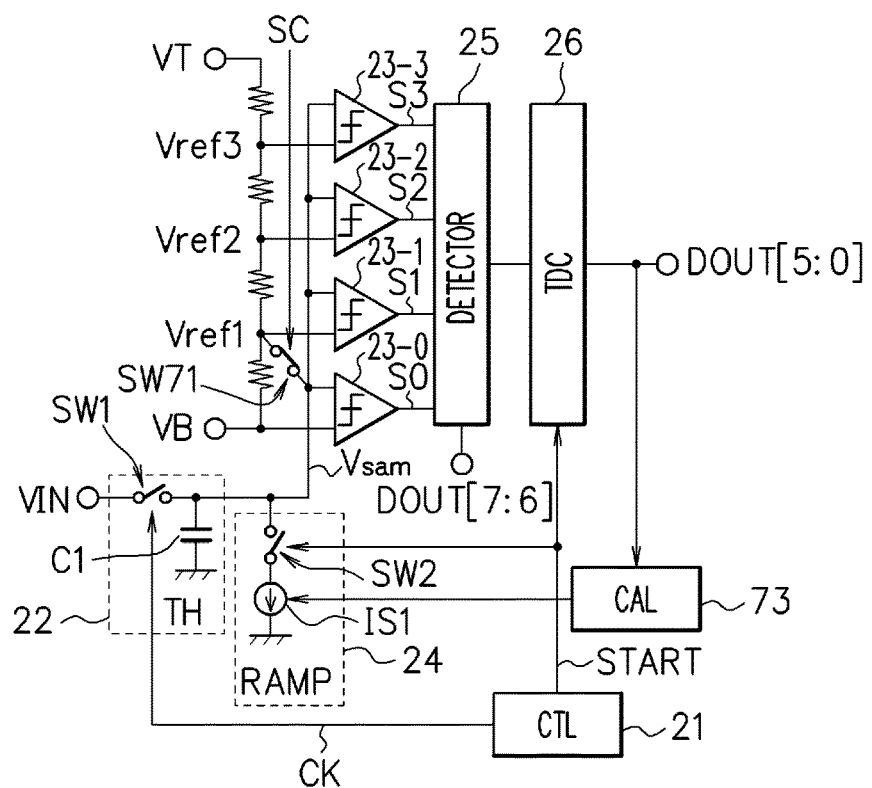
FIG. 7B is a diagram explaining an example of error correction in the analog-digital converter in the first embodiment.

FIG. 7A to FIG. 7C are views to explain error correction in the analog-digital converter in the first embodiment. In the analog-digital converter in the first embodiment, a processing unit to perform the AD conversion relating to the two bits DOUT[7:6] on the higher-order side of the digital signal DOUT[7:0] and a processing unit to perform the AD conversion relating to the six bits DOUT[5:0] on the lower-order side of the digital signal DOUT[7:0] differ from each other.

Therefore, the potential difference corresponding to the digital value "1" in the processing unit to perform the AD conversion relating to the two bits DOUT[7:6] on the higher-order side and the potential difference corresponding to the digital value "64" (the maximum value) in the processing unit to perform the AD conversion relating to the six bits DOUT[5:0] on the lower-order side have to be equal to each other. That is, each potential difference between the adjacent potentials in the order of the potentials VB, Vref1, Vref2, Vref3, and VT has to be 64Δt (Δt is the time resolution of the time to digital converter 26).

As long as each potential difference between the adjacent potentials in the order of the potentials VB, Vref1, Vref2, Vref3, and VT is 64Δt, the digital signal DOUT responsive to the analog input signal VIN becomes a value expressed by a continuous straight line 71 having a constant inclination as indicated by a dotted line in FIG. 7A. On the other hand, when each potential difference between the adjacent potentials in the order of the potentials VB, Vref1, Vref2, Vref3, and VT is larger than 64Δt, the digital signal DOUT responsive to the analog input signal VIN becomes a value expressed by a discontinuous straight line 72 as indicated by a solid line in FIG. 7A.

What is necessary to bring each potential difference between the adjacent potentials in the order of the potentials VB, Vref1, Vref2, Vref3, and VT to 64Δt is to further provide a switch SW71 and a correction control circuit (CAL) 73 as illustrated in FIG. 7B, for example and to adjust the current amount in the current source IS1 in the ramp circuit 24. The switch SW71 is a switch intended for supplying the reference potential Vref1 to the input node of the input potential $V_{sam}$ and is on/off controlled by a control signal SC. The control circuit 21 may output the control signal SC, or the correction control circuit 73 may output the control signal SC. The correction control circuit 73 adjusts the current amount in the current source IS1 in the ramp circuit 24 based on the output of the time to digital converter 26.

There will be explained an operation when adjusting the current amount in the current source IS1. First, at the time of the sampling operation of the AD conversion processing, the switch SW71 is turned on (conducted) by the control signal SC to supply the reference potential Vref1 to the input node of the input potential $V_{sam}$. Incidentally, the clock signal CK is brought to a low level, and input of the analog input signal VIN is not performed. After the switch SW71 is turned off (not conducted) by the control signal SC, the comparing operation of the AD conversion processing is started. Since the input potential $V_{sam}$ is the reference potential Vref1 when the comparing operation of the AD conversion processing starts, the output signal S0 of the comparator 23-0 is at a high level and the output signals S1 to S3 of the other comparators 23-1 to 23-3 are at a high level.

Thereafter, when the ramp circuit 24 reduces the input potential $V_{sam}$ at a constant speed and then the input potential $V_{sam}$ and the reference potential VB become equal to each other, the output signal S0 of the comparator 23-0 transits to a low level from a high level. Thereby, a value obtained by converting a time difference taken until the input potential $V_{sam}$ becomes the reference potential VB from the reference potential Vref1 to a digital value is output from the time to digital converter 26. The correction control circuit 73 adjusts the current amount in the current source IS1 in the ramp circuit 24 by increasing and reducing the current amount based on the digital value output from the time to digital converter 26.

In this embodiment, when the digital value output from the time to digital converter 26 is larger than "64," the correction control circuit 73 increases the current amount in the current source IS1 so as to accelerate the speed at which the input potential $V_{sam}$ is reduced. On the other hand, when the digital value output from the time to digital converter 26 is smaller than "64," the correction control circuit 73 reduces the current amount in the current source IS1 so as to slow the speed at which the input potential $V_{sam}$ is reduced.

In this manner, as illustrated in FIG. 7C, the current amount in the current source IS1 in the ramp circuit 24 is adjusted so that a time difference 74 taken until the input potential $V_{sam}$ becomes the reference potential VB from the reference potential Vref1 becomes 64 Δt. Appropriate adjustment of the current amount in the current source IS1 in the ramp circuit 24 makes it possible to obtain such good AD conversion characteristics as expressed by the dotted line straight line 71 in FIG. 7A. Incidentally, although in the aforementioned explanation, as the input potential $V_{sam}$, the reference potential Vref1 is supplied to perform the adjustment, as the input potential $V_{sam}$, the reference potential Vref2 or Vref3 may be supplied to adjust the current amount in the current source IS1 in the ramp circuit 24 based on a time difference taken until input potential $V_{sam}$ becomes the potential Vref1 or Vref2 from the reference potential Vref2 or Vref3.

Figure 8:
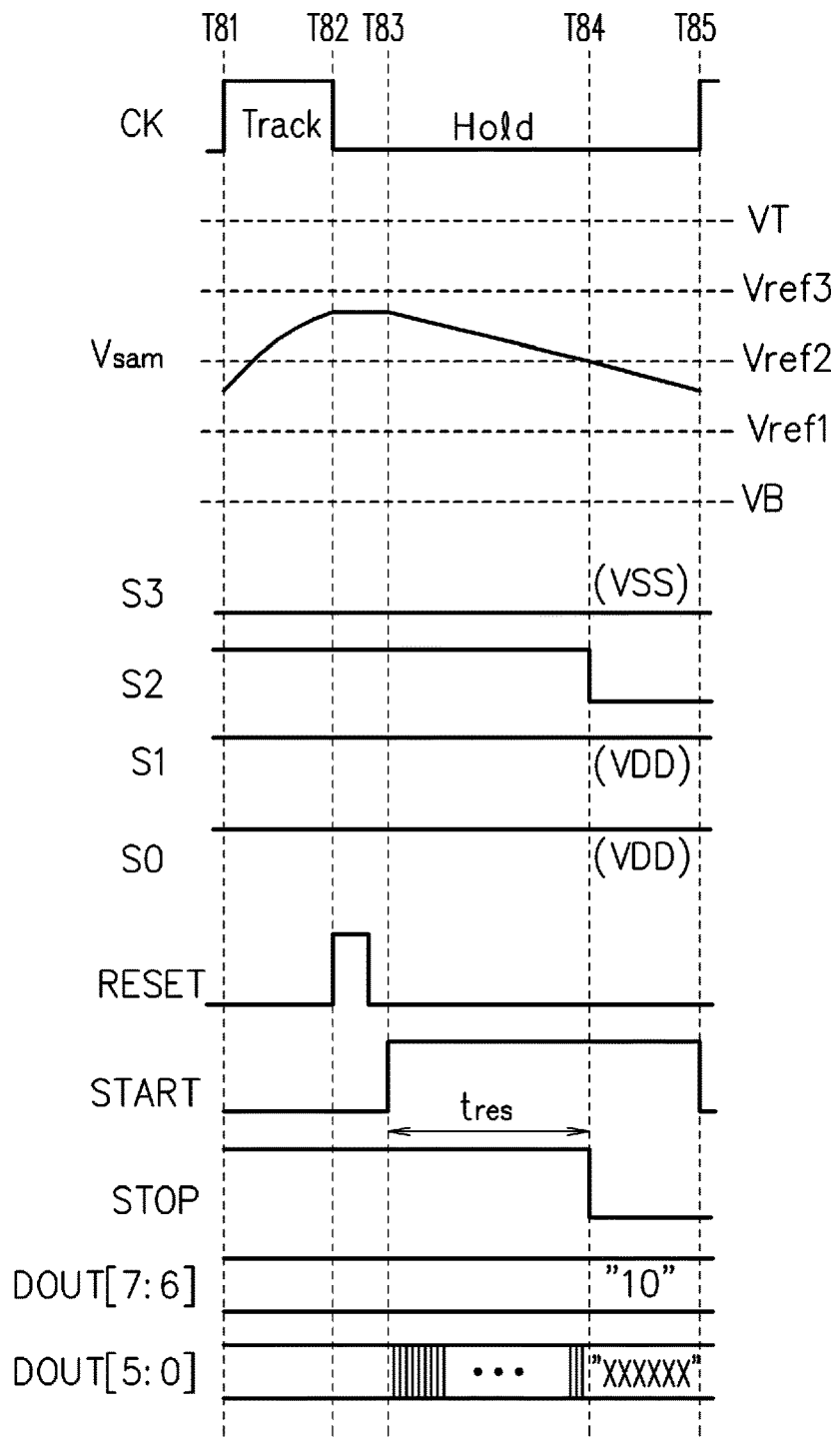
FIG. 8 is a timing chart illustrating an operation example of the analog-digital converter in the first embodiment.
Figure 9A:
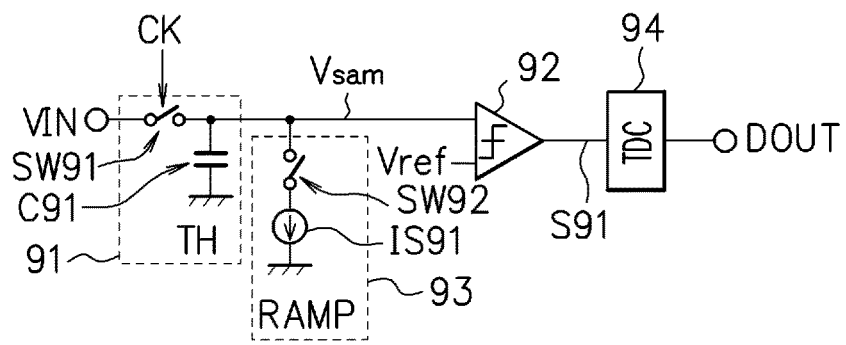
FIG. 9A is a diagram illustrating a configuration example of a single-slope analog-digital converter.
Figure 9B:
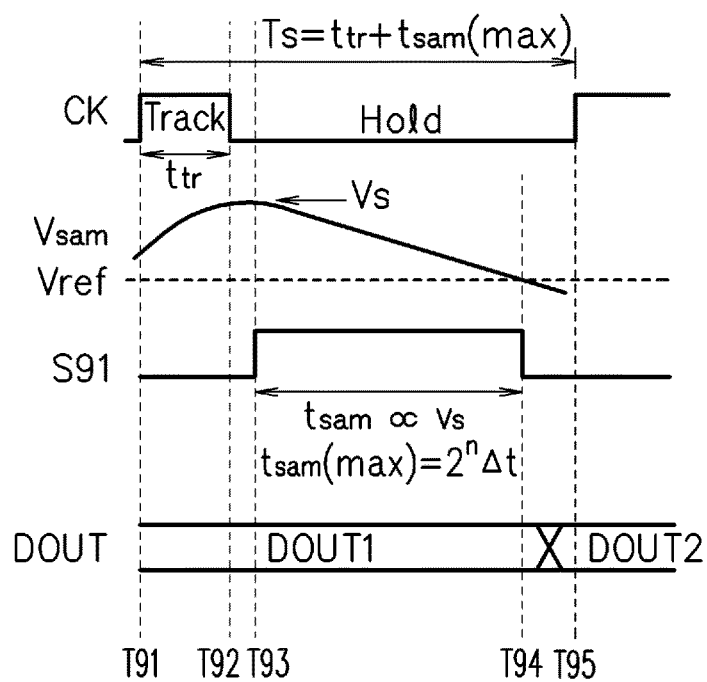
FIG. 9B is a view explaining an operation of the single-slope analog-digital converter.

There will be explained an operation of the analog-digital converter in the first embodiment with reference to FIG. 8. FIG. 8 is a timing chart illustrating an operation example of the analog-digital converter in the first embodiment.

At a time T81 to a time T82, the clock signal CK is brought to a high level, the track and hold circuit 22 enters a track mode, and the track and hold circuit 22 samples the analog input signal VIN. After the track and hold circuit 22 samples the analog input signal VIN, the reset signal RESET is input to reset the detection circuit 25 (the flip-flops 41-0 to 41-3 therein). Incidentally, the reset processing of the detection circuit 25 may be performed by the time the ramp circuit 24 starts to reduce the input potential $V_{sam}$ (at or before a time T83 in this example).

Then, at the time T83, the start signal START is transited to a high level from a low level. The start signal START is brought to a high level, and thereby the input potential $V_{sam}$ reduces at a constant speed by the ramp circuit 24. Further, the start signal START is brought to a high level, and thereby the time to digital converter 26 starts to measure a time since the start signal START is brought to a high level.

When the input potential $V_{sam}$ reduces by the ramp circuit 24 and at a time T84, the input potential $V_{sam}$ and the reference potential Vref2 become equal, the output signal S2 of the comparator 23-2 transits to a low level from a high level. As a result that the output signal S2 of the comparator 23-2 has transited to a low level from a high level, the detection circuit 25 transits the stop signal STOP to a low level from a high level and at the same time, determines the value of the two bits DOUT[7:6] on the higher-order side of the digital signal DOUT[7:0] as "10" to output it.

Further, the stop signal STOP is brought to a low level, and thereby the time to digital converter 26 finishes the measurement of the time. Then, the time to digital converter 26 outputs the digital value obtained by conversion of the time $t_{res}$ taken until the stop signal STOP is brought to a low level after the start signal START is brought to a high level as the six bits DOUT[5:0] on the lower-order side of the digital signal DOUT[7:0]. Thereafter, at a time T85, the clock signal CK is brought to a high level again, and the following AD conversion is started.

According to the first embodiment, the parallel AD converter and the single-slope AD converter are combined to perform the AD conversion, thereby making it possible to reduce the number of bits of the single-slope AD converter, resulting in that it becomes possible to perform the AD conversion at a high speed without impairing the advantages of the single-slope AD converter. Further, as illustrated in FIG. 4A as one example, the detection circuit, and the like can be fabricated by a small number of logic circuits, and thus the area and the power consumption of a circuit to be added in this embodiment are extremely small, resulting in that it is possible to suppress increases in the circuit area and the power consumption.

Second Embodiment

Next, there will be explained a second embodiment of the present invention.

The four comparators 23-0 to 23-3 used in the AD converter in the first embodiment illustrated in FIG. 2A as an example each constantly have to keep comparing the input potential according to the analog input signal and the reference potential, and thus are a comparator called a continuous time comparator that constantly performs a comparison. The continuous time comparator flows a current constantly, and thus its power consumption is large. In an AD converter in the second embodiment to be explained below, comparators called discrete-time comparators, each of which takes in an input signal in synchronization with a clock signal and performs a comparison, are used to achieve the reduction in power consumption of the AD converter.

Figure 10:
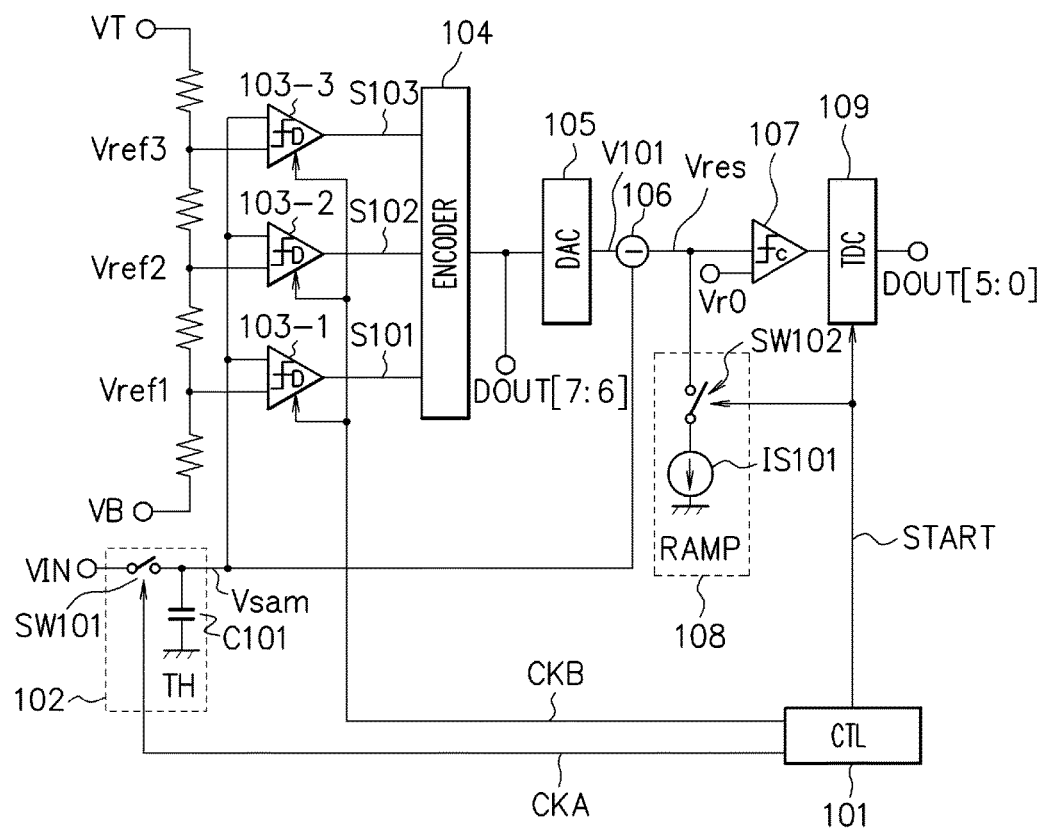
FIG. 10 is a diagram illustrating a configuration example of an analog-digital converter in a second embodiment.

FIG. 10 is a diagram illustrating a configuration example of the AD converter in the second embodiment. FIG. 10 illustrates, as one example, an AD converter that converts an analog input signal VIN to an 8-bit digital signal DOUT[7:0]. In this example, AD conversion processing of two bits DOUT[7:6] on the higher-order side of the digital signal DOUT[7:0] is performed in a parallel AD converter, and AD conversion processing of six bits DOUT[5:0] on the lower-order side of the digital signal DOUT[7:0] is performed in a single-slope AD converter.

The AD converter in the second embodiment illustrated in FIG. 10 as an example includes: a control circuit 101; a track and hold circuit 102; comparators (discrete-time comparators) 103-1, 103-2, and 103-3; an encoder 104; a digital-analog converter (DA converter) 105; a subtracter 106; a comparator (continuous time comparator) 107; a ramp circuit 108; and a time to digital converter 109. The function as the parallel AD converter is achieved by the comparators 103-1 to 103-3, the encoder 104, and so on, and the function as the single-slope AD converter is achieved by the comparator 107, the ramp circuit 108, the time to digital converter 109, and so on.

The control circuit 101 controls the AD conversion processing from the analog input signal VIN to the digital signal DOUT overall. For example, the control circuit 101 outputs a clock signal CKA to control the operation of the track and hold circuit 102, a clock signal CKB to control the operations of the comparators 103-1 to 103-3, and a start signal START to control the operations of the ramp circuit 108 and the time to digital converter 109.

The track and hold circuit 102 includes: a switch SW101 that is on/off controlled by the clock signal CKA and transmits the analog input signal VIN; and a holding capacitance C101 that holds the analog input signal VIN transmitted via the switch SW101. When the clock signal CKA is at a high level, the switch SW101 is turned on (conducted) (a track mode) and the track and hold circuit 102 transmits the analog input signal VIN to an output end. Further, when the clock signal CKA is at a low level, the switch SW101 is turned off (is not conducted) (a hold mode) and the track and hold circuit 102 holds the analog input signal VIN transmitted in the track mode.

The comparators 103-1 to 103-3 each are a discrete-time comparator that takes in an input signal in synchronization with the clock signal CKB and performs a comparison. The comparators 103-1 to 103-3 are brought into a reset state when the clock signal CKB is at a low level, and the comparators 103-1 to 103-3 are brought into a comparing operation state when the clock signal CKB is at a high level.

An input potential $V_{sam}$ and a reference potential Vref1 are input to the comparator 103-1, and the comparator 103-1 compares the input potential $V_{sam}$ and the reference potential Vref1 to output an output signal S101 according to a result of the comparison. The input potential $V_{sam}$ and a reference potential Vref2 are input to the comparator 103-2, and the comparator 103-2 compares the input potential $V_{sam}$ and the reference potential Vref2 to output an output signal S102 according to a result of the comparison. Further, the input potential $V_{sam}$ and a reference potential Vref3 are input to the comparator 103-3, and the comparator 103-3 compares the input potential $V_{sam}$ and the reference potential Vref3 to output an output signal S103 according to a result of the comparison.

Here, the input potential $V_{sam}$ is a potential according to the analog input signal VIN sampled by the track and hold circuit 102. The reference potentials Vref1, Vref2, and Vref3 are generated by a resistor ladder circuit that includes a plurality of resistors each having the same resistance value connected in series resistance-dividing the voltage between a reference voltage VB on the low-potential side and a reference voltage VT on the high-potential side, for example, and the potential increases by a constant potential difference in the order of the potentials VB, Vref1, Vref2, Vref3, and VT.

Figure 11:
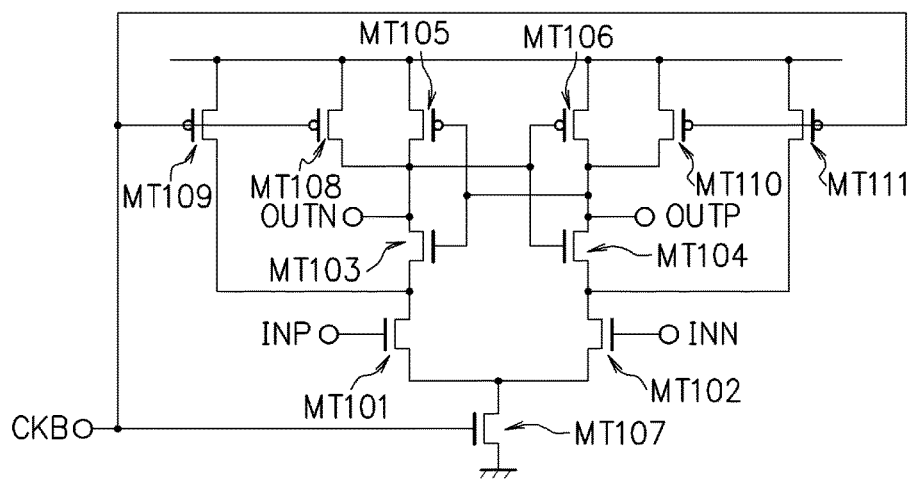
FIG. 11 is a diagram illustrating a configuration example of a discrete-time comparator in the second embodiment.

Each configuration example of the comparators 103 (103-1 to 103-3) in this embodiment is illustrated in FIG. 11. The comparator 103 illustrated in FIG. 11 includes: N-channel MOS transistors MT101, MT102, MT103, MT104, and MT107; and P-channel MOS transistors MT105, MT106, MT108, MT109, MT110, and MT111.

The transistor MT101 has an input signal INP supplied to a gate thereof, has a source thereof connected to a drain of the transistor MT107, and has a drain thereof connected to a source of the transistor MT103. The transistor MT102 has an input signal INN supplied to a gate thereof, has a source thereof connected to the drain of the transistor MT107, and has a drain thereof connected to a source of the transistor MT104. In the comparator 103 in this embodiment, the input potential $V_{sam}$ is input as the input signal INP and the reference potential is input as the input signal INN.

A drain of the transistor MT103 and a drain of the transistor MT105 are connected and a potential of a connection point of them is output as an output signal OUTN. A drain of the transistor MT104 and a drain of the transistor MT106 are connected and a potential of a connection point of them is output as an output signal OUTP. In the comparator 103 in this embodiment, the output signal OUTP is output to the encoder 104 as an output signal of the comparator 103.

Further, gates of the transistors MT103 and MT105 are connected to the connection point of the drain of the transistor MT104 and the drain of the transistor MT106. Gates of the transistors MT104 and MT106 are connected to the connection point of the drain of the transistor MT103 and the drain of the transistor MT105. A power supply voltage is supplied to sources of the transistors MT105 and MT106. That is, the transistors MT103 and MT105 are connected so as to configure an inverter, and the transistors MT104 and MT106 are connected so as to configure an inverter. Then, an output of one of the inverters is connected to an input of the other of the inverters, and the transistors MT103, MT104, MT105, and MT106 configure a latch circuit.

The transistor MT107 has a source thereof connected to a reference voltage and has the clock signal CKB supplied to a gate thereof. A power supply voltage is supplied to sources of the transistors MT108, MT109, MT110, and MT111, and the clock signal CKB is supplied to gates thereof.

A drain of the transistor MT108 is connected to the connection point of the drain of the transistor MT103 and the drain of the transistor MT105, and a drain of the transistor MT109 is connected a connection point of the drain of the transistor MT101 and the source of the transistor MT103. Further, a drain of the transistor MT110 is connected to the connection point of the drain of the transistor MT104 and the drain of the transistor MT106, and a drain of the transistor MT111 is connected to a connection point of the drain of the transistor. MT102 and the source of the transistor MT104.

In the comparator illustrated in FIG. 11, when the clock signal CKB is at a low level, the transistor MT107 is turned off and the transistors MT108 to MT111 are turned on. Thereby, the connection point of the drain of the transistor MT104 and the drain of the transistor MT106 (the output signal OUTP) and the connection point of the drain of the transistor MT103 and the drain of the transistor MT105 (the output signal OUTN) are reset to a high level. Further, the connection point of the drain of the transistor MT101 and the source of the transistor MT103 and the connection point of the drain of the transistor MT102 and the source of the transistor MT104 are reset to a high level.

Further, in the comparator illustrated in FIG. 11, when the clock signal CKB is at a high level, the transistor MT107 is turned on and the transistors MT108 to MT111 are turned off. Thereby, a differential amplifier circuit configured by the transistors MT101 and MT102 is brought into an operation state, and a potential difference between the input signals INP and INN is amplified. The amplified signals are latched in the latch circuit configured by the transistors MT103 to MT106, and the magnitude relationship between the input signals INP and INN is output as the output signals OUTP and OUTN. When the potential of the input signal INP is higher than that of the input signal INN, the output signal OUTP is brought to a high level, and when the potential of the input signal INP is lower than that of the input signal INN, the output signal OUTP is brought to a low level.

Therefore, when the input potential $V_{sam}$ is higher than the reference potential as a result that the comparators 103-1 to 103-3 illustrated in FIG. 10 each compare the input potential $V_{sam}$ and the input reference potential, the output signals S101 to S103 are brought to a high level (a power supply voltage VDD). On the other hand, when the input potential $V_{sam}$ is equal to or less than the reference potential, the output signals S101 to S103 are brought to a low level (a reference voltage VSS). Here, in the comparator illustrated in FIG. 11, the current does not flow into the circuits after the states of the output signals OUTP and OUTN are determined, and thus use of the discrete-time comparator illustrated in FIG. 11 as the comparators 103-1 to 103-3 makes it possible to reduce the power consumption as compared to the case of using the continuous time comparator.

The encoder 104 encodes the output signals S101 to S103 of the comparators 103-1 to 103-3 to convert the resultant to the two bits DOUT[7:6] on the higher-order side of the digital signal DOUT[7:0] to output a value. When the output signal S103 is at a high level, the encoder 104 outputs "11" as the digital signal DOUT[7:6], and when the output signal S103 is at a low level and the output signal S102 is at a high level, the encoder 104 outputs "10" as the digital signal DOUT[7:6]. Further, when the output signals S103 and S102 are at a low level and the output signal S101 is at a high level, the encoder 104 outputs "01" as the digital signal DOUT[7:6], and when the output signals S101 to S103 are all at a low level, the encoder 104 outputs "00" as the digital signal DOUT[7:6].

The DA converter 105 digital-analog converts the digital signal DOUT[7:6] output from the encoder 104 to output a potential V101 according to the digital signal DOUT[7:6]. The DA converter 105 sets the output potential V101 to the potential VB when the digital signal DOUT[7:6] is "00," and sets the output potential V101 to the potential Vref1 when the digital signal DOUT[7:6] is "01." Further, the DA converter 105 sets the output potential V101 to the potential Vref2 when the digital signal DOUT[7:6] is "10," and sets the output potential V101 to the potential Vref3 when the digital signal DOUT[7:6] is "11."

The input potential $V_{sam}$ and the output potential V101 from the DA converter 105 are input to the subtracter 106, and the subtracter 106 outputs a potential (residual component) $V_{res}$ obtained by subtracting the output potential V101 from the input potential $V_{sam}$. That is, the subtracter 106 outputs the potential (residual component) $V_{res}$ obtained by subtracting the output potential V101 according to the digital signal DOUT[7:6] determined by the parallel AD converter configured by the comparators 103-1 to 103-3, the encoder 104, and the like from the input potential $V_{same}$ according to the analog input signal VIN. That is, the subtracter 106 outputs the residual component $V_{res}$ corresponding to the six bits DOUT[5:0] on the lower-order side resulting from conversion of the input potential $V_{sam}$ to the digital signal DOUT[7:0].

The ramp circuit 108 includes: a switch SW102 that is on/off controlled by the start signal START; and a current source IS101 that is connected to a node that supplies the potential (residual component) $V_{res}$ via the switch SW102. When the start signal START is at a high level, the switch SW102 is turned on, the current source IS101 is connected to the node that supplies the potential (residual component)

$V_{res}$, and the ramp circuit 108 reduces the potential (residual component) $V_{res}$ at a constant speed.

The comparator 107 is a continuous time comparator capable of keeping performing a comparison constantly, and is configured in the same manner as the comparator 23 in the first embodiment illustrated in FIG. 2A as an example. The potential (residual component) $V_{res}$ output from the subtracter 106 and a reference potential Vr0 are input to the comparator 107, and the comparator 107 compares the potential (residual component) $V_{res}$ and the reference potential Vr0 to output an output signal according to a result of the comparison. When the DA converter 105 outputs the potentials VB, Vref1, Vref2, and Vref3 according to the digital signal DOUT[7:6] as described previously, the reference potential Vr0 is 0 (zero). When the potential (residual component) $V_{res}$ is higher than the reference potential Vr0, the comparator 107 brings the output signal to a high level, and when the ramp circuit 108 reduces the potential (residual component) $V_{res}$ and the potential (residual component) $V_{res}$ becomes equal to the reference potential Vr0, the comparator 107 brings the output signal to a low level.

The time to digital converter 109 measures a time difference taken until the output signal of the comparator 107 transits to a low level after the start signal START transits to a high level and converts the time difference to a digital value, to thereby determine the value of the six bits DOUT[5:0] on the lower-order side of the digital signal DOUT[7:0]. The time to digital converter 109 is configured in the same manner as the time to digital converter 26 in the first embodiment illustrated in FIG. 5 and FIG. 6A as an example, and the output signal of the comparator 107 corresponds to the stop signal STOP.

The time at which the start signal START has transited to a high level corresponds to the time at which the ramp circuit 108 starts to reduce the potential (residual component) $V_{res}$, and thus the time difference measured by the time to digital converter 109 is equivalent to the result resulting from conversion of the potential (residual component) $V_{res}$ to a time. Accordingly, by the time to digital converter 26, the measured time difference is converted to a digital value, thereby obtaining the value of a digital signal DOUT[5:0].

When the AD converter in the second embodiment converts the analog input signal VIN to the 8-bit digital signal DOUT[7:0], the parallel AD converter configured by the comparators 103-1 to 103-3, the encoder 104, and the like performs the AD conversion processing of the two bits DOUT[7:6] on the higher-order side of the digital signal DOUT[7:0]. Then, by the DA converter 105 and the subtracter 106, the residual component $V_{res}$ obtained by subtracting the digital signal DOUT[7:6] determined by the parallel AD converter from the analog input signal VIN is generated. The single-slope AD converter configured by the comparator 107, the ramp circuit 108, the time to digital converter 109, and the like AD converts this residual component $V_{res}$ to determine the six bits DOUT[5:0] on the lower-order side of the digital signal DOUT[7:0].

According to the second embodiment in this manner, similarly to the first embodiment, it becomes possible to reduce the number of bits of the single-slope AD converter and perform the AD conversion at a high speed without impairing the advantages of the single-slope AD converter. Further, the use of the discrete-time comparator with small power consumption for the comparators 103-1 to 103-3 configuring the parallel AD converter makes it possible to reduce the power consumption of the AD converter. Further, as a configuration that achieves the functions of the DA converter 105 and the subtracter 106 to generate the residual component $V_{res}$, for example, as illustrated in FIG. 12, a capacitive DA converter is applied, thereby enabling a simple configuration and making it possible to suppress the power consumption to be small.

FIG. 12 is a diagram illustrating another configuration example of the analog-digital converter in the second embodiment. The analog-digital converter illustrated in FIG. 12 is that the DA converter 105 and the subtracter 106 in the analog-digital converter illustrated in FIG. 10 are replaced with a capacitive DA converter 121. Incidentally, in FIG. 12, the same reference numerals and symbols are added to the components having the same functions as those of the components illustrated in FIG. 10, and their overlapping explanations are omitted.

The analog input signal VIN and the digital signal DOUT[7:6] output from the encoder 104 are input to the capacitive DA converter 121, the capacitive DA converter 121 outputs the potential (residual component) $V_{res}$ obtained by subtracting a potential according to the digital signal DOUT[7:6] from the analog input signal VIN. That is, when the digital signal DOUT[7:6] is "11," the capacitive DA converter 121 outputs the potential $V_{res}$ obtained by subtracting the potential Vref3 from the analog input signal VIN, and when the digital signal DOUT[7:6] is "10," the capacitive DA converter 121 outputs the potential $V_{res}$ obtained by subtracting the potential Vref2 from the analog input signal VIN. Further, when the digital signal DOUT[7:6] is "01," the capacitive DA converter 121 outputs the potential $V_{res}$ obtained by subtracting the potential Vref1 from the analog input signal VIN, and when the digital signal DOUT[7:6] is "00," the capacitive DA converter 121 outputs the potential $V_{res}$ obtained by subtracting the potential VB from the analog input signal VIN.

FIG. 13 is a diagram illustrating a configuration example of the capacitive DA converter 121 in this embodiment. The capacitive DA converter 121 includes: three capacitances C131, C132, and C133; and four switches SW131, SW132, SW133, and SW134. It is set that the capacitance C131 and the capacitance C132 are equal in a capacitance value, and a capacitance value of the capacitance C133 is twice as large as each capacitance value of the capacitances C131, C132.

One electrodes of the capacitances C131, C132, and C133 are connected to an output node OUT. To the one electrodes of the capacitances C131, C132, and C133, a common voltage Vcom can be supplied via the switch 134. Further, the analog input signal VIN, the reference voltage VT on the high-potential side, and the reference voltage VB on the low-potential side can be supplied selectively to the other electrodes of the capacitances C131, C132, and C133 via the switches SW131, SW132, and SW133.

In the capacitive DA converter illustrated in FIG. 13, in a track period (a period when the clock signal CKA is at a high level), the common voltage Vcom is supplied to the one electrodes of the capacitances C131, C132, and C133 via the switch SW134, and the analog input signal VIN is supplied to the other electrodes of the capacitances C131, C132, and C133 via the switches SW131, SW132, and SW133. When the track period is finished, the switches SW131, SW132, SW133, and SW134 are turned off and the analog input signal VIN when the track period is finished is sampled and held in the capacitances C131, C132, and C133.

Thereafter, according to the digital signal DOUT[7:6] output from the encoder 104, which is a conversion result of the parallel AD converter, a changeover of each of the switches SW131, SW132, and SW133 is performed. The switch SW131 is controlled so that the reference voltage VB on the low-potential side can be supplied to the other electrode of the capacitance C131 regardless of the digital signal DOUT[7:6].

The switch SW132 is controlled according to a digital signal DOUT[6]. The switch SW132 is controlled so that the reference voltage VT on the high-potential side can be supplied to the other electrode of the capacitance C132 when the digital signal DOUT[6] is "1," and the switch SW132 is controlled so that the reference voltage VB on the low-potential side can be supplied to the other electrode of the capacitance C132 when the digital signal DOUT[6] is "0." Further, the switch SW133 is controlled according to a digital signal DOUT[7]. The switch SW133 is controlled so that the reference voltage VT on the high-potential side can be supplied to the other electrode of the capacitance C133 when the digital signal DOUT[7] is "1," and the switch SW133 is controlled so that the reference voltage VB on the low-potential side can be supplied to the other electrode of the capacitance C133 when the digital signal DOUT[7] is "0."

As above, the changeover of each of the switches SW131, SW132, and SW133 is performed according to the digital signal DOUT[7:6], and thereby electric charges accumulated in each of the capacitances C131, C132, and C133 are redistributed and the potential obtained by subtracting the potential according to the digital signal DOUT[7:6] from the analog input signal VIN is output to the output node OUT.

As described previously, the use of the capacitive DA converter makes it possible to integrate the functions of the DA converter 105 and the subtracter 106 illustrated in FIG. 10. The capacitive DA converter can be configured only by the capacitances and the switches as illustrated in FIG. 13, thereby enabling reductions in the circuit area and the power consumption. Further, since the capacitances each having the residual component $V_{res}$ accumulated therein are connected to the output node of the capacitive DA converter, only the direct connection of the ramp circuit 108 to the output node of the capacitive DA converter enables a ramp operation, resulting in creating an advantage of enabling simplification of the circuit configuration.

Incidentally, although the example where the AD conversion processing of two bits on the higher-order side is performed in the parallel AD converter and the AD conversion of six bits on the lower-order side is performed in the single-slope AD converter has been described in the previous explanation, the present invention is not limited to this. The number of bits of the parallel AD converter and the single-slope AD converter can be set appropriately according to the number of bits of an output digital signal, and the like, and only needs to be set appropriately considering the circuit area, the conversion speed, or the like. For example, a parallel AD converter including $2^p$ pieces of comparators and a single-slope AD converter having a q-bit conversion accuracy are combined, thereby making it possible to perform AD conversion to a (p+q)-bit digital signal.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

INDUSTRIAL APPLICABILITY

As above, according to the present invention, conversion of the higher-order side of a digital signal is performed in a parallel analog-digital converter and conversion of the lower-order side of the digital signal is performed in a single-slope analog-digital converter, thereby making it possible to reduce the number of bits of the single-slope analog-digital converter, resulting in that it is possible to provide an analog-digital converter capable of performing high-speed analog-digital conversion with a small area and low power consumption.

The invention claimed is:

1. An analog-digital converter being an analog-digital converter that converts an input analog input signal to a digital signal, the analog-digital converter, comprising:
    a track and hold circuit that samples the analog input signal;
    a parallel analog-digital converter that includes a plurality of comparators and determines a value of a certain number of bits on the higher-order side of the digital signal based on outputs of the plurality of comparators, the plurality of comparators to which an input potential according to the sampled analog input signal and reference potentials different from one another are input and that each compare the input potential and the reference potential; and
    a single-slope analog-digital converter that reduces the input potential according to the sampled analog input signal at a constant speed, converts a time taken until the reduced input potential becomes equal to the reference potential corresponding to the value determined in the parallel analog-digital converter to a digital value, and determines a value of remaining bits on the lower-order side of the digital signal.

2. The analog-digital converter according to claim 1, wherein
    a time taken until any one of the outputs of the plurality of comparators included in the parallel analog-digital converter transits after the single-slope analog-digital converter starts to reduce the input potential according to the analog input signal is set to the time taken until the reduced input potential becomes equal to the reference potential.

3. The analog-digital converter according to claim 1, wherein
    the reference potentials are set to increase one another by a constant potential difference.

4. An analog-digital converter being an analog-digital converter that converts an input analog input signal to a digital signal, the analog-digital converter, comprising:
    a track and hold circuit that samples the analog input signal;
    a ramp circuit that reduces an input potential according to the sampled analog input signal at a constant speed;
    a plurality of comparators to which the input potential and reference potentials different from one another are input and that each compare the input potential and the reference potential;
    a detection circuit that, while the ramp circuit reducing the input potential, detects an output that has transited earliest out of outputs of the plurality of comparators and determines a value of a certain number of bits on the higher-order side of the digital signal based on a detection result; and
    a time to digital converter that converts a time taken until the detection circuit detects the output that has transited earliest after the ramp circuit starts to reduce the input potential to a digital value and determines a value of remaining bits on the lower-order side of the digital signal.

5. The analog-digital converter according to claim 4, further comprising:
a switch via which, to the comparator to which a first reference potential out of the plurality of reference potentials is input, a second reference potential out of the plurality of reference potentials, being different from the first reference potential, is changed to the input potential to be input; and
a correction control circuit that adjusts, based on an output of the time to digital converter obtained when the ramp circuit reduces the second reference potential input to the comparator at a constant speed, a speed at which the ramp circuit reduces a potential.

6. The analog-digital converter according to claim 4, wherein
the detection circuit includes:
a plurality of first flip-flops to which an output of the corresponding comparator out of the plurality of comparators is input respectively and that each transit an output thereof when the output of the corresponding comparator to be input transits;
an operation circuit that performs a logical operation relating to the value on the higher-order side of the digital signal using the outputs of the first flip-flops; and
a plurality of second flip-flops that take in, when any one of the outputs of the plurality of first flip-flops transits, an output of the operation circuit and hold the output.

7. The analog-digital converter according to claim 6, further comprising:
a switch via which, to the comparator to which a first reference potential out of the plurality of reference potentials is input, a second reference potential out of the plurality of reference potentials, being different from the first reference potential, is changed to the input potential to be input; and
a correction control circuit that adjusts, based on an output of the time to digital converter obtained when the ramp circuit reduces the second reference potential input to the comparator at a constant speed, a speed at which the ramp circuit reduces a potential.

8. The analog-digital converter according to claim 4, wherein
the reference potentials are set to increase one another by a constant potential difference.

9. An analog-digital converter being an analog-digital converter that converts an input analog input signal to a digital signal, the analog-digital converter, comprising:
a track and hold circuit that samples the analog input signal;
a plurality of first comparators to which an input potential according to the sampled analog input signal and first reference potentials different from one another are input and that each compare the input potential and the first reference potential;
a first encoder that determines a value of a certain number of bits on the higher-order side of the digital signal based on outputs of the plurality of first comparators;
a residual generation circuit that generates a residual component obtained by subtracting a potential corresponding to the determined value on the higher-order side of the digital signal from the input potential;
a second comparator to which the residual component and a second reference potential are input and that compares the residual component and the second reference potential;
a ramp circuit that reduces the residual component input to the second comparator at a constant speed; and
a time to digital converter that converts a time taken until an output of the second comparator transits after the ramp circuit starts to reduce the residual component to a digital value and determines a value of remaining bits on the lower-order side of the digital signal, wherein
the plurality of first comparators are discrete-time comparators whose reset state and comparing operation state are switched according to a level of a clock signal and that each take in inputs and compare the inputs when being in the comparing operation state, and
the second comparator is a continuous time comparator that constantly performs a comparison of inputs.

10. The analog-digital converter according to claim 9, wherein
the time to digital converter includes:
a ring oscillator that outputs an oscillation signal when the ramp circuit starts to reduce the residual component;
a switch that is brought into an on state during a period until the output of the second comparator transits after the ramp circuit starts to reduce the residual component; and
a counter that counts an output of the ring oscillator to be input thereto via the switch.

11. The analog-digital converter according to claim 10, wherein
the residual generation circuit includes:
a digital-analog converter that digital-analog converts an output of the first encoder and outputs the potential corresponding to the determined value on the higher-order side of the digital signal; and
a subtracter that subtracts the potential output by the digital-analog converter from the input potential.

12. The analog-digital converter according to claim 10, wherein
the residual generation circuit is a capacitive digital-analog converter to which the analog input signal and an output of the first encoder and that outputs the residual component obtained by subtracting the potential corresponding to the value on the higher-order side of the digital signal from the input potential according to the analog input signal.

13. The analog-digital converter according to claim 9, wherein
the time to digital converter includes:
a ring oscillator that outputs an oscillation signal when the ramp circuit starts to reduce the residual component;
a counter that counts an output of the ring oscillator;
a plurality of flip-flops that are connected to internal nodes of the ring oscillator and take in states of the internal nodes when the output of the second comparator transits and output the states; and
a second encoder that determines the value of the remaining bits on the lower-order side of the digital signal based on a count value of the counter and outputs of the plurality of flip-flops.

14. The analog-digital converter according to claim 13, wherein
the residual generation circuit includes:
a digital-analog converter that digital-analog converts an output of the first encoder and outputs the potential corresponding to the determined value on the higher-order side of the digital signal; and
a subtracter that subtracts the potential output by the digital-analog converter from the input potential.

15. The analog-digital converter according to claim 13, wherein
the residual generation circuit is a capacitive digital-analog converter to which the analog input signal and an output of the first encoder and that outputs the residual component obtained by subtracting the potential corresponding to the value on the higher-order side of the digital signal from the input potential according to the analog input signal.

16. The analog-digital converter according to claim 9, wherein
the residual generation circuit includes:
a digital-analog converter that digital-analog converts an output of the first encoder and outputs the potential corresponding to the determined value on the higher-order side of the digital signal; and
a subtracter that subtracts the potential output by the digital-analog converter from the input potential.

17. The analog-digital converter according to claim 9, wherein
the residual generation circuit is a capacitive digital-analog converter to which the analog input signal and an output of the first encoder and that outputs the residual component obtained by subtracting the potential corresponding to the value on the higher-order side of the digital signal from the input potential according to the analog input signal.

* * * * *